(12) United States Patent
Kaneko

(10) Patent No.: US 9,759,489 B2
(45) Date of Patent: Sep. 12, 2017

(54) HEAT TREATMENT APPARATUS

(71) Applicant: TOKYO ELECTRON LIMITED, Tokyo (JP)

(72) Inventor: Hirofumi Kaneko, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 482 days.

(21) Appl. No.: 14/023,093

(22) Filed: Sep. 10, 2013

(65) Prior Publication Data

US 2014/0072925 A1    Mar. 13, 2014

(30) Foreign Application Priority Data

Sep. 13, 2012 (JP) ................. 2012-201400

(51) Int. Cl.
| | |
|---|---|
| F27D 1/00 | (2006.01) |
| F27D 7/02 | (2006.01) |
| F27B 17/00 | (2006.01) |
| H01L 21/67 | (2006.01) |
| C23C 16/44 | (2006.01) |
| C23C 16/54 | (2006.01) |

(52) U.S. Cl.
CPC ........ F27D 1/0023 (2013.01); C23C 16/4409 (2013.01); C23C 16/54 (2013.01); F27B 17/0025 (2013.01); F27D 7/02 (2013.01); H01L 21/6719 (2013.01); H01L 21/67109 (2013.01)

(58) Field of Classification Search
CPC ................ F27D 1/0023; F27D 1/0026; F27D 2099/0081; F27D 2099/0078; F27D 99/0076; F27D 99/0073; F27D 7/02; H01L 21/67757; F16D 1/0817; F27B 17/0025

USPC ......................................... 414/935
See application file for complete search history.

(56) References Cited

U.S. PATENT DOCUMENTS 4,565,237 A * 1/1986 Draizen ............. B22D 11/0651
                                                    164/423

FOREIGN PATENT DOCUMENTS

| JP | 2000-223432 A | 8/2000 |
|---|---|---|
| TW | 502299 B | 9/2002 |
| TW | 200828436 A | 7/2008 |
| TW | 200839852 A | 10/2008 |
| TW | M392271 U1 | 11/2010 |
| TW | 201209916 A1 | 3/2012 |

OTHER PUBLICATIONS

Hong, TWM392271_Translation, Nov. 2010, All (Machine Translation of TWM392271).*
Obara, TW502299_Translation, Nov. 2002, All (Machine Translation of TW502299).*

* cited by examiner

*Primary Examiner* — Steven B McAllister
*Assistant Examiner* — Steven Anderson, II
(74) *Attorney, Agent, or Firm* — Nath, Goldberg & Meyer; Jerald L. Meyer

(57) ABSTRACT

A heat treatment apparatus includes: a reaction tube processing a plurality of substrates; a support member supporting the reaction tube; a flange protruding outwardly from a lower end of the reaction tube: a concave portion formed in an outer periphery of the flange; and a rotatable roller installed in a top surface of the support member. The rotatable roller engages the concave portion and positions the reaction tube in a circumferential direction.

7 Claims, 9 Drawing Sheets

FIG. 12

HEAT TREATMENT APPARATUS

CROSS-REFERENCE TO RELATED APPLICATION

This application claims the benefit of and priority from Japanese Patent Application No. 2012-201400, filed on Sep. 13, 2012, in the Japan Patent Office, the disclosure of which is incorporated herein in its entirety by reference.

TECHNICAL FIELD

The present disclosure relates to a heat treatment apparatus having a reaction tube, more particularly to a heat treatment apparatus which can support the reaction tube without damaging the reaction tube.

BACKGROUND

For example, in a process of manufacturing a semiconductor device, various kinds of heat treatment apparatuses have been used in order to perform chemical vapor deposition (CVD), diffusion, oxidation, annealing or the like on a target object of a semiconductor wafer. Above all, in a CVD treatment and a diffusion treatment under a depressurization with a relative high pressure, the heat treatment apparatus has a vertically extending reaction tube which is made of quartz and supported by a manifold made of metal, which has a gas introduction unit and an exhaust unit. A processing region within the reaction tube accommodates the semiconductor wafers therein, which are held in a multistage manner by a holding unit such as a wafer boat. After the processing region sealed, it is heated to a predetermined process temperature by a heater installed outside the reaction tube. As such, a predetermined heat treatment is performed with respect to the semiconductor wafers with a predetermined process gas under a predetermined process pressure.

In such a heat treatment apparatus, the reaction tube has a double tube structure including an inner tube and an outer tube, which are made of quartz. The inner tube is supported by a support ring formed on an inner surface of the manifold. A concave portion is formed at a lower end outer periphery of the inner tube. A protrusion, which engages the concave portion to position a circumferential direction of the inner tube, is formed in the support ring.

The support ring thermally expands or contracts during the process of the heat treatment as a temperature within the reaction tube changes. When the support ring thermally expands or contracts, the inner tube may be dislocated on the support ring.

At this time, the concave portion of the inner tube may thermally contract in a state where it is in contact with the protrusion of the support ring and the inner tube may be interposed between a contact point, at which the concave portion is in contact with the protrusion, and an opposite position to the contact point. As a result, a vicinity of the concave portion having a weak strength may be broken.

SUMMARY

Various embodiments of the present disclosure provide a heat treatment apparatus which can support a reaction tube without damage of the reaction tube during a process of a heat treatment.

According to the present disclosure, there is provided a heat treatment apparatus including: a reaction tube processing a plurality of substrates; a support member supporting the reaction tube; a flange protruding outwardly from a lower end of the reaction tube: a concave portion formed in an outer periphery of the flange; and a rotatable roller installed in a top surface of the support member. The rotatable roller engages the concave portion and positions the reaction tube in a circumferential direction.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 12 is a partial longitudinal sectional view showing one modified embodiment of a heat treatment apparatus according to the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Descriptions will be made below in detail as to embodiments of the present disclosure with reference to attached drawings. FIGS. 1 to 11 show a heat treatment apparatus according to the present disclosure.

First, descriptions will be made as to an outline of the heat treatment apparatus according to the present disclosure with reference to FIGS. 1 and 2.

Figure 1:
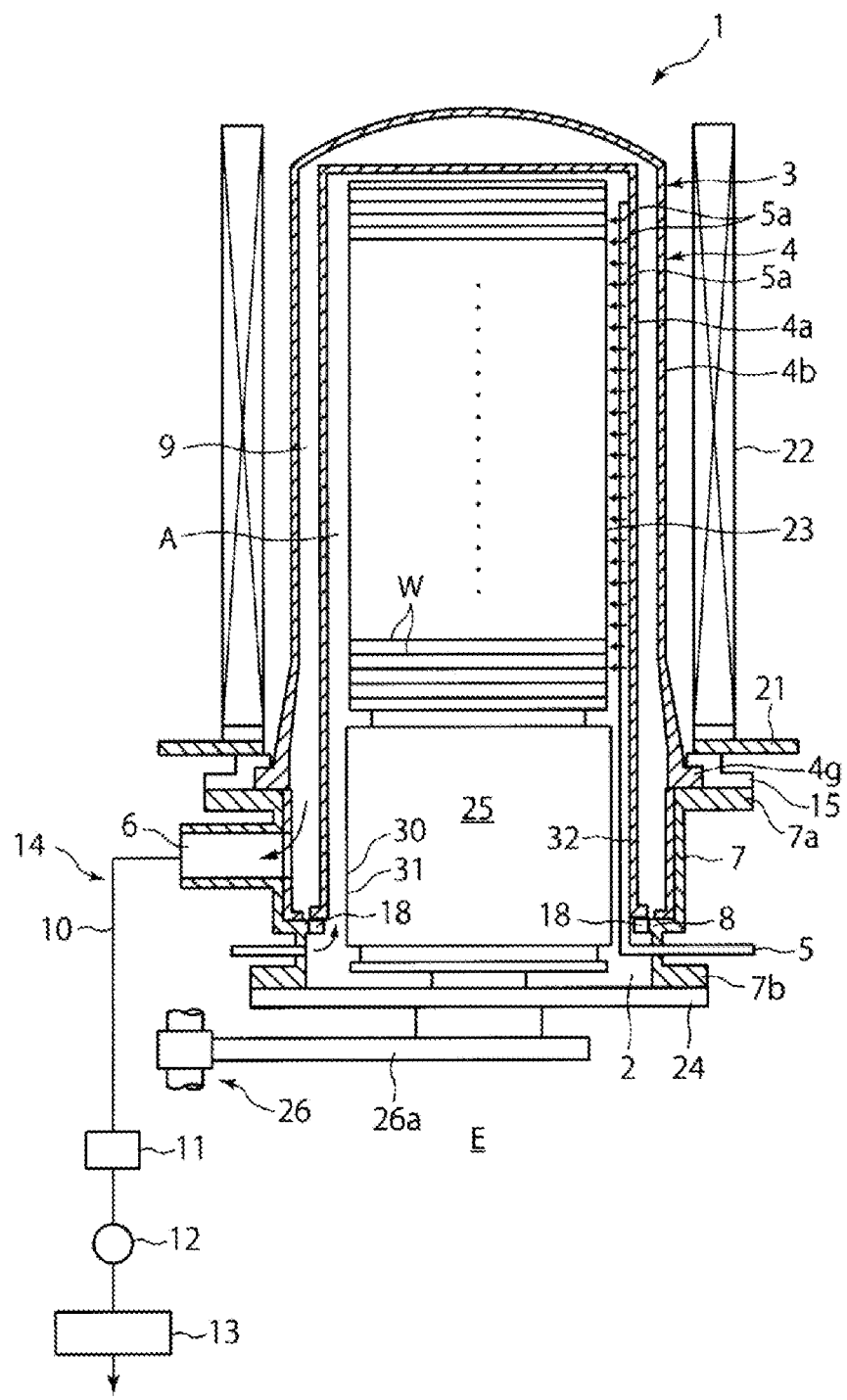
FIG. 1 is a longitudinal sectional view showing a heat treatment apparatus according to the present disclosure.
Figure 2:
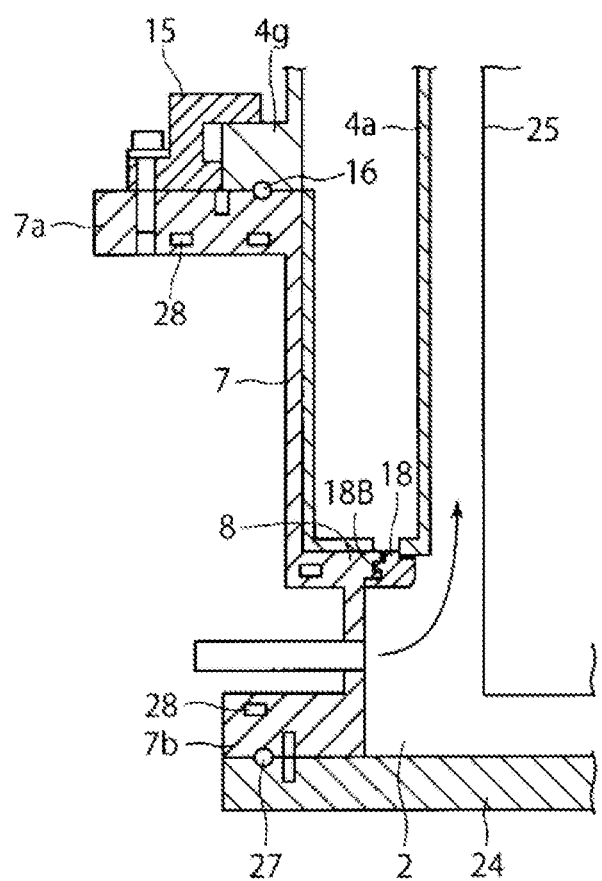
FIG. 2 is an enlarged view showing a main portion of the heat treatment apparatus.

As shown in FIG. 1, a vertical heat treatment apparatus 1 includes a heat treatment furnace 3 having a furnace opening 2 at its lower portion. The heat treatment furnace 3 includes: a vertically extending reaction tube 4 made of quartz as a processing container; a manifold 7 supporting a lower end of the reaction tube 4; a gas introduction unit 5 installed in the manifold 7 and introducing a process gas into a processing region A within the reaction tube 4 (identical to the processing region within the heat treatment furnace); an exhaust unit 6 installed in the manifold 7 and exhausting gas from the processing region A.

The furnace opening 2 is defined by a lower portion of the manifold 7. The reaction tube 4 has a double tube structure including an inner tube 4a and an outer tube 4b. The inner tube 4a is sealed at an upper end and opened at a lower end. The outer tube 4b is closed at an upper end and opened at a lower end. A ring shaped path 9 is formed between the inner tube 4a and the outer tube 4b. The gas introduction unit 5 extends upwardly. A plurality of process gas introduction holes 5a are formed along a vertical direction in the gas introduction unit 5. The process gas is supplied from the process gas introduction holes 5a into the processing region A in a horizontal direction. The process gas, which is supplied into the processing region A, flows via an opening (not shown) having a slit shape and corresponding to the gas introduction unit 5 of the inner tube 4a to thereby be sent to the ring shaped path 9 between the inner tube 4a and the outer tube 4b. Thereafter, the process gas flows downwardly to be exhausted.

The manifold 7 may be made of a material having heat resistance and corrosion resistance, for example, a stainless steel. The gas introduction unit 5 includes an injector pipe of an L-shape. The gas introduction unit 5 is air-tightly inserted through a side wall below an inner flange 8 which will be described later. The gas introduction unit 5 vertically extends along an inner wall of the inner tube 4a so as to introduce the process gas from the vertically formed process gas introduction holes 5a toward the processing region A within the reaction tube 4 in a horizontal direction. A plurality of gas introduction units 5 for different kinds of gases may be installed along a circumferential direction of the manifold 7.

The exhaust unit 6 is installed in the side wall above the inner flange 8 of the manifold 7 to communicate with the ring shaped path 9 between the inner tube 4a and the outer tube 4b. A combination valve 11, which can control the processing region A within the reaction tube 4 at a predetermined process pressure, for example, 26.6 Pa to 93100 Pa (0.2 Torr to 700 Torr), a vacuum pump 12 and a scrubbing device 13 are installed in the exhaust pipe 10 in this order. The exhaust pipe 10, which includes the combination valve 11, the vacuum pump 12 and the scrubbing device 13, and the exhaust unit 6 constitute an exhaust system 14. In a state where the processing region A is controlled at the predetermined process pressure by the exhaust system 14, the process gas, which is injected from the plurality of vertically formed gas introduction holes 5a, is supplied into the processing region A within the inner tube 4a of the reaction tube 4 in the horizontal direction to be used for a predetermined heat treatment. Thereafter, the process gas flows downwardly along the ring shaped path 9 between the inner tube 4a and the outer tube 4b to thereby be exhausted from the exhaust unit 6.

Flange members 7a and 7b are formed integrally with the manifold 7 at an upper end and a lower end of the manifold 7, respectively. A lower end flange member 4g of the outer tube 4b is mounted on a top surface of an upper end flange 7a. The top surface of the upper end flange 7a is fixed by a flange pressing member 15 of a ring shape, which surrounds the lower end flange member 4g. As shown in FIG. 2, for example, an O-ring 16 is positioned between the upper end flange 7a of the manifold 7 and the lower end flange member 4g of the outer tube 4b for sealing therebetween.

Figure 3:
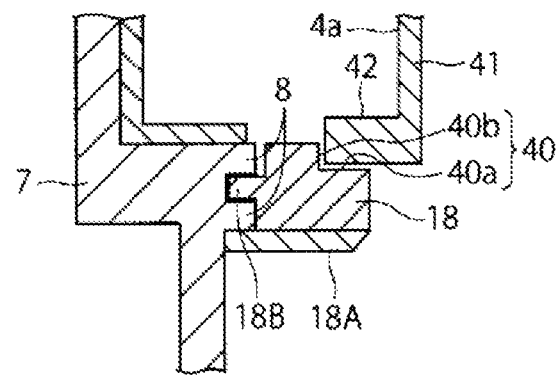
FIG. 3 is an enlarged view showing a support ring supporting an inner tube.

As described above, the inner flange 8 is formed in an inner periphery of the manifold 7. A support ring 18 for supporting the lower end of the inner tube 4a is held in the inner flange 8. As shown in FIGS. 2 to 3, the support ring 18 is made of a material having heat resistance and corrosion resistance, for example, Inconel, in a ring shape. The support ring 18 is removably fixed to the inner flange 8 of the manifold 7 by a plurality of projections 18B formed in an outer periphery thereof and a pressing plate 18A fixed to a lower end thereof 18 by a screw.

Further, descriptions will be made later as to the support ring 18 installed in the manifold 7.

The manifold 7 is installed below a base plate 21. A heater 22, which can heat the processing region A within the reaction tube 4 at a predetermined process temperature, for example, 300 degrees C. to 1100 degrees C., is installed above the base plate 21. The heater 22 includes a heat insulation member having a cylindrical shape surrounding a periphery of the heater 22 which includes an upper portion of the reaction tube 4, and a resistance heating element installed in an inner periphery of the heat insulation member.

The semiconductor wafer W is held by a wafer boat 23 as a holding unit such that a plurality of, for example, about 150 sheets of the horizontally oriented semiconductor wafers W as the target objects (referred to as a target substrate) are received and held in the processing region A within the reaction tube 4 to have a predetermined vertical interval in a multistage manner. The wafer boat 23 is mounted on a thermal insulation container 25 as a heat insulation member above a vertically movable lid 24 for sealing the furnace opening 2. The lid 24 is made of a material having heat resistance and corrosion resistance, for example, stainless steel.

A loading area E is formed below the heat treatment furnace 3. An elevating mechanism 26, which is configured to move the lid 24 vertically to thereby load/unload the wafer boat 23 and the thermal insulation container 25 into/from the reaction tube 4 and open and close the furnace opening 2, is installed in the loading area E. An O-ring 27 is installed in a joint portion between the lower end flange 7b of the manifold 7 and the lid 24. A cooling water path 28 as a cooling means, which is configured to circulate cooling water in order to prevent a thermal degradation of the O-rings 16 and 27, is formed in the upper end flange 7a and the lower end flange 7b of the manifold 7.

Next, descriptions will be made in detail as to the support ring 18 fixed to the manifold 7 and supporting the inner tube 4a with reference to FIGS. 3 to 10.

Figure 4:
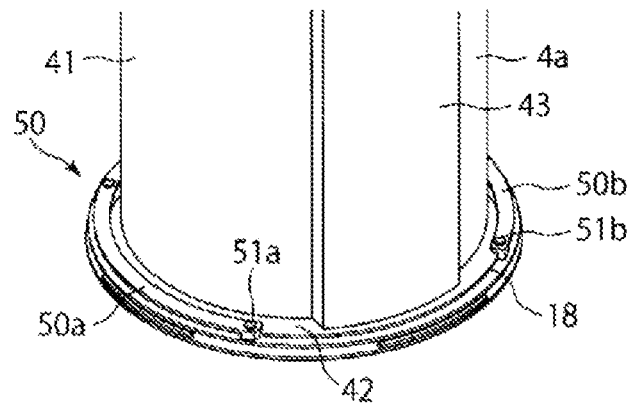
FIG. 4 is a perspective view showing the inner tube.
Figure 5:
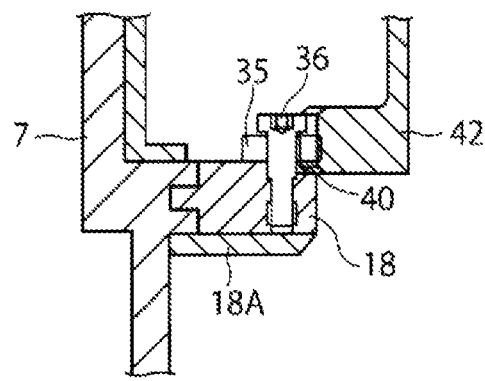
FIG. 5 is a sectional view showing a rotatable roller installed in the support ring.

First, descriptions will be made as to the inner tube 4a. As shown in FIG. 4, the inner tube 4a has an inner tube body 41 and a flange 42 formed at a lower end of the inner tube body 41. A gas introduction space member 43, which radially protrudes outward, is formed on the inner tube body 41. The gas introduction space member 43 accommodates the gas introduction unit 5 extending within the inner tube 4a. An outer edge of the flange 42 of the inner tube 4a has a substantially perfect circle shape.

Further, a protruding length of the gas introduction space member 43 in a radial direction is equal to or less than a protruding length of the flange 42 in a radial direction. As such, the gas introduction space member 43 does not directly interfere with a vertical surface 40b of the support ring 18. As a result, even if the support ring 18 repeats a thermal expansion and a thermal contraction, it is possible to prevent the gas introduction space member 43 from being forcibly depressed by the vertical surfaces 40b of the support ring 18 being damaged.

The inner tube 4a having such a configuration is supported by the support ring 18 fixed to the manifold 7.

As described above, the inner flange 8 protrudes from the inner periphery of the manifold 7. The support ring 18 having a ring shape is removably fixed to the inner flange 8 of the manifold 7 by the plurality of projections 18B formed in an outer periphery thereof and the pressing plate 18A fixed to the lower end of the support ring 18 by a screw.

Further, the support ring 18 has a stepped portion 40 on which the lower end of the inner tube 4a is mounted to be supported. The stepped portion 40 includes a horizontal surface 40a on which the flange 42 of the inner tube 4a is mounted and the vertical surface 40b coming into contact with the outer periphery of the flange 42 for positioning a radial direction of the inner tube 4a (see FIG. 3).

Further, as shown in FIGS. 5 and 8 to 10, a concave portion 44 is formed in the outer periphery of the flange 42 of the inner tube 4a. A rotatable roller 35, which engages the concave portion 44 of the inner tube 4a to position a circumferential direction of the inner tube 4a with respect to the support ring 18, is installed in the support ring 18.

The rotatable roller 35 is rotatably installed by inserting a fixed pin 36 to the support ring 18. A portion of the rotatable roller 35 is located at the side of the stepped portion 40 and configured to be engaged into the concave portion 44 of the flange 42 of the inner tube 4a. The fixed pin 36 includes a head 36A having a hexagonal hole 36d and a shaft 36B having a smaller diameter than the head 36A. Further, the shaft 36B has a small diameter shaft 36c and a large diameter shaft 36b. A stepped portion 36e is formed by the large diameter shaft 36b and the small diameter shaft 36c. An inserting depth of the fixed pin 36 is limited by a stepped portion 18d formed in a pin hole 18c of the support ring 18. At this time, a distance between a lower end surface of the head 36A of the fixed pin 36 and the support ring 18 is set to be larger than a height of the rotatable roller 35. As a result, even if the fixed pin 36 is too deeply inserted, there's no possibility for the rotatable roller 35 to be stuck or locked. Further, the fixed pin 36 may be fixed by means of a friction force between the shaft 36B and the pin hole 18c by setting the respective diameters of the shaft 36B and the pin hole 18c or a screw engagement between the small shaft 36c and the pin hole 18c by forming threads in the small diameter shaft 36c and the pin hole 18c.

Further, the horizontal surface 40a of the stepped portion 40 of the support ring 18 is a smooth surface having, for example, a center line average roughness (Ra) of about 0.8 to 3.2. The inner tube 4a can easily slide on the horizontal surface 40a of the stepped portion 40.

That is, as will be described later, for example, even if the concave portion 44 of the inner tube 4a and the rotatable roller 35 are dislocated with respect to each other, the rotatable roller 35 rotates to slide the inner tube 4a on the horizontal surface 40a of the stepped portion 40 during the thermal contraction of the support ring 18. As such, the rotatable roller 35 can be surely engaged into the concave portion 44 of the inner tube 4a.

Figure 6A:
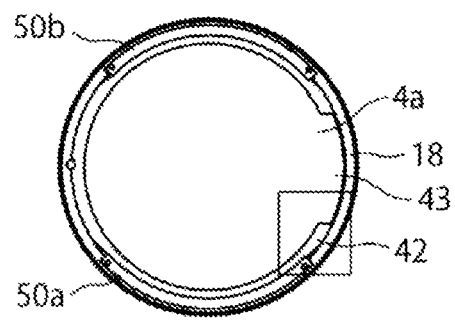
FIG. 6A is a top view showing an anti-inversion ring installed in the support ring.
Figure 6B:
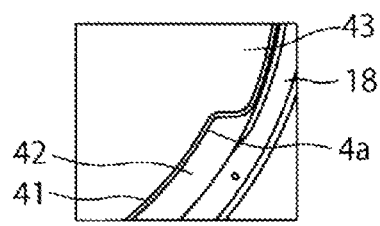
FIG. 6B is a partial enlarged view of FIG. 6A.
Figure 7:
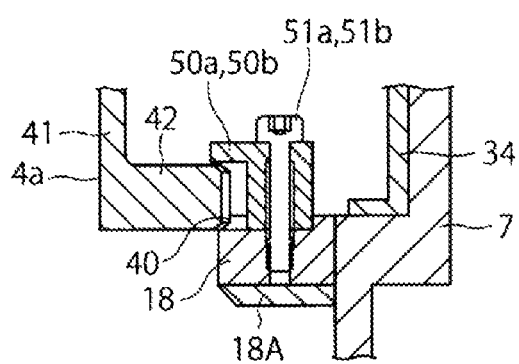
FIG. 7 is a sectional view showing the anti-inversion ring installed in the support ring.

Further, as shown in FIGS. 6 and 7, an anti-inversion ring 50, which covers the flange 42 of the inner tube 4a from an upper position, is installed on the support ring 18.

The anti-inversion ring 50 includes a pair of partial rings 50a and 50b which are separated from each other and have a circular arc shape. The partial rings 50a and 50b are fixed on the support ring 18 by set screws 51a and 51b, respectively.

Further, the pair of partial rings 50a and 50b are disposed and fixed such that they are symmetric with respect to a diameter of the inner tube 4a passing the gas introduction space member 43.

Next, descriptions will be made as to operations of the vertical heat treatment apparatus having the foregoing configurations.

While the heat treatment is performed with respect to the semiconductor wafer W, the reaction tube 4 including the inner tube 4a is heated by the heater 22 and then cooled.

Next, description will be made as to behaviors of the inner tube 4a and the support ring 18 when the reaction tube 4 including the inner tube 4a is repeatedly heated and cooled.

For example, when the heater 22 heats the reaction tube 4, the support ring 18 thermally expands and then its diameter becomes larger. As such, the inner tube 4a on the stepped portion 40 of the support ring 18 is spaced from the vertical surface 40b of the stepped portion 40 and moves slightly on the horizontal surface 40a of the stepped portion 40 to have a predetermined clearance on the stepped portion 40.

Figure 8:
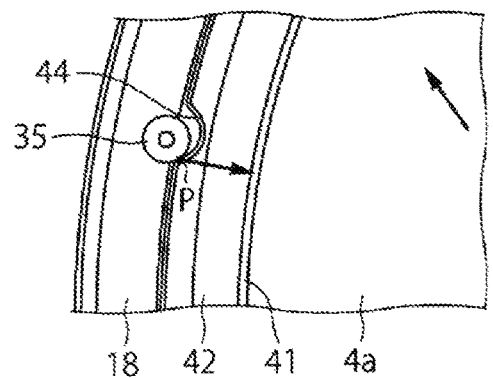
FIG. 8 shows operations of the present disclosure.

If the inner tube 4a moves on the stepped portion 40 of the support ring 18 as described above, the rotatable roller 35 may escape from a center of the concave portion 44 formed in the flange 42 of the inner tube 4a (see FIG. 8).

Next, when the heater 22 stops heating, the support ring 18 thermally contracts and then its diameter becomes smaller. At this time, the concave portion 44 of the inner tube 4a is in contact with the rotatable roller 35 at a contact point P. If the support ring 18 further thermally contracts and then its diameter becomes smaller, the rotatable roller 35 rotates. As the rotatable roller 35 rotates, the inner tube 4a is pressed by the rotatable roller 35 to thereby slide along a circumferential direction on the horizontal surface 40a of the stepped portion 40. In this case, since the horizontal surface 40a has a smooth surface having the center line average roughness (Ra) of about 0.8 to 3.2, the inner tube 4a can smoothly slide on the horizontal surface 40a of the stepped portion 40. Further, since the flange 42 of the inner tube body 41 has the perfect circle shape, the support ring 18 thermally contracts toward a center of the inner tube 4a. Thus, if the inner tube 4a is sandwiched between the rotatable roller 35 and a position of the support ring 18 opposed to the rotatable roller 35, the flange 42 rotates and slides in one direction. As a result, the flange 42 can be returned to a predetermined installed position in a smooth manner.

Figure 9:
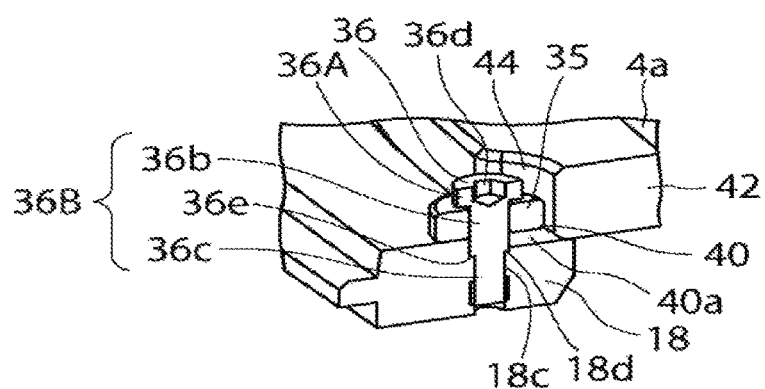
FIG. 9 is a cutaway perspective view showing the rotatable roller installed in the support ring.
Figure 10:
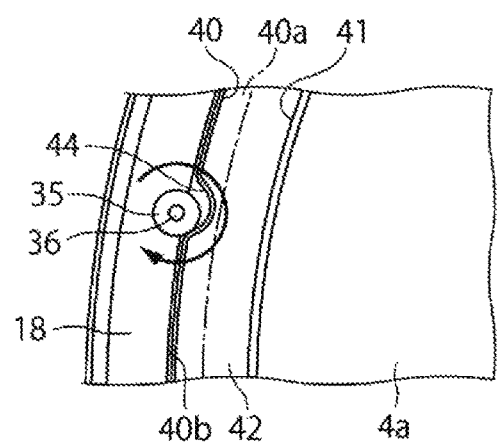
FIG. 10 is a top view showing the rotatable roller installed in the support ring.

Since the inner tube 4a slides on the horizontal surface 40a of the stepped portion 40, the rotatable roller 35 of the support ring 18 can be completely engaged with the concave portion 44 of the inner tube 4a (see FIGS. 9 and 10).

Figure 11:
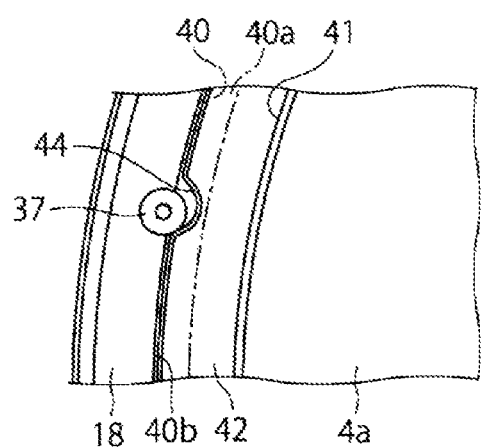
FIG. 11 shows a comparative example where a fixed roller is installed in the support ring instead of the rotatable roller.

Meanwhile, as in an example shown in FIG. 11 for comparison purpose, a fixed roller 37 not rotatable, which may be engaged with the concave portion 44 of the inner tube 4a, may be installed in the support ring 18. In this case, if the support ring 18 thermally contracts in a situation where an entrance of the concave portion 44 of the inner tube 4a is in contact with the fixed roller 37, the inner tube 4a may be sandwiched between this contact point and the position opposed thereto. As such, when the fixed roller 37 is used, the inner tube 4a may be still damaged (see FIG. 11).

In contrast, according to the present disclosure, as described above, the rotatable roller 35 rotates and then the inner tube 4a slides on the horizontal surface 40a of the stepped portion 40 during the thermal contraction of the support ring 18. That is, the rotatable roller 35 can completely engage the concave portion 44 of the inner tube 4a. Further, since the rotatable roller 35 is not caught at an entrance of the concave portion 44 of the inner tube 4a, the damage to the inner tube 4a can be avoided.

Since the pair of partial rings 50a and 50b of the anti-inversion ring 50 covers the upper portion the flange 42 of the inner tube 4a with a predetermined gap, the anti-inversion ring 50 can completely prevent the inversion of the inner tube 4a. Further, the inner tube 4a can slide on the stepped portion 40 of the support ring 18 without any obstruction during the thermal contraction of the support ring 18.

Meanwhile, the conventional anti-inversion ring 50 has a C shape and is fixed by screws at not balanced positions to avoid contact with the gas introduction space member 43 of the inner tube 4a. As such, since the conventional anti-inversion ring 50 includes portions having a strong strength and a weak strength, the inner tube 4a is apt to be dislocated. In contrast, according to the present disclosure, since the pair of partial rings 50a and 50b are disposed and fixed such that they are bilateral symmetric with respect to the diameter of the inner tube 4a passing the gas introduction space member 43, the inner tube 4a can be fixed with a uniform force exerted by the anti-inversion ring 50. As a result, it is possible to avoid the dislocation of the inner tube 4a in a biased direction during the thermal expansion or the thermal contraction.

Modified Embodiment

Next, descriptions will be made as to a modified embodiment of the present disclosure with reference to FIG. 12. Further, in the modified embodiment shown in FIG. 12, the same reference numerals are used to designate the same elements as the embodiment shown in FIGS. 1 to 11 and the descriptions thereof will be omitted.

Although, in the embodiment shown in FIGS. 1 to 11, an example where the reaction tube 4 has the double tube structure including the inner tube 4a and the outer tube 4b, the inner tube 4a of the reaction tube 4 is supported by the support ring 18 as a support member, and the inner tube 4a is supported by the stepped portion 40 of the support ring 18 is shown, the present disclosure is not limited thereto and a reaction tube 4 may have a single tube structure.

Figure 12:
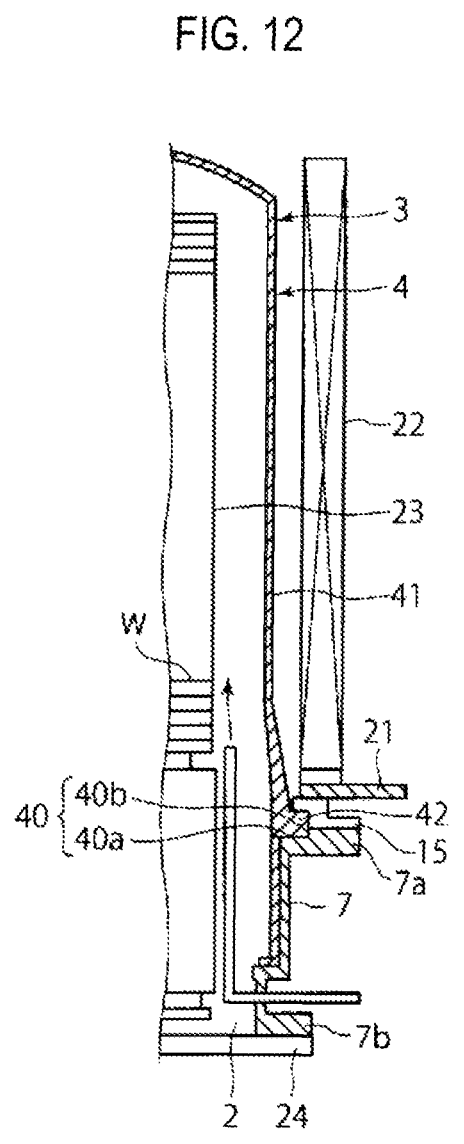

As shown in FIG. 12, the reaction tube 4 of the single tube structure is supported by the manifold 7 as the support member. The upper end flange 7a having the stepped portion 40 on which the reaction tube 4 is mounted is formed at an upper portion of the manifold 7.

The reaction tube 4 has a reaction tube body 41 and the flange 42 formed at a lower end of the reaction tube body 41. The stepped portion 40 formed in the manifold 7 includes a horizontal surface 40a on which the flange 42 of the reaction tube 4 is mounted and the vertical surface 40b coming into contact with the outer periphery of the flange 42 for positioning a radial direction of the flange 42.

The concave portion 44 is formed at the outer periphery of the flange 42 of the reaction tube 4. The rotatable roller 35 (see FIG. 8), which engages the concave portion 44 of the flange 42 to locate the reaction tube 4 in a circumferential direction, is installed in the stepped portion 40.

In the modified embodiment shown in FIG. 12, when the manifold 7 thermally contracts during a heat treatment process, the rotatable roller 35 rotates while the reaction tube 4 slides on the horizontal surface 40a of the stepped portion 40. As such, the rotatable roller 35 can completely engage the concave portion 44 of the reaction tube 4. Further, since the rotatable roller 35 is not caught at the entrance of the concave portion 44 of the reaction tube 4, the reaction tube 4 cannot be damaged.

Further, as shown in FIG. 12, the manifold 7 is installed below the base plate 21. The heater 22, which heats the semiconductor wafers W supported by the wafer boat 23 within the reaction tube 4, is installed above the base plate 21.

The flange pressing member 15 pressing the flange 42 of the reaction tube 4 is installed in the upper end flange 7a of the manifold 7.

The lid 24 goes into contact with the lower end flange 7b of the manifold 7 to close the furnace opening.

Next, descriptions will be made as to another modified embodiment of the present disclosure with reference to FIG. 13. Further, in the modified embodiment shown in FIG. 13, the same reference numerals are used to designate the same elements as the embodiment shown in FIGS. 1 to 11 and descriptions thereof will be omitted.

In the embodiment shown in FIGS. 1 to 11, the reaction tube 4 has the double tube structure including the inner tube 4a and the outer tube 4b, the inner tube 4a of the reaction tube 4 is supported by the support ring 18 as a support member, and the inner tube 4a is supported by the stepped portion 40 of the support ring 18. However, the present disclosure is not limited thereto and a reaction tube 4 may have the single tube structure.

Figure 13:
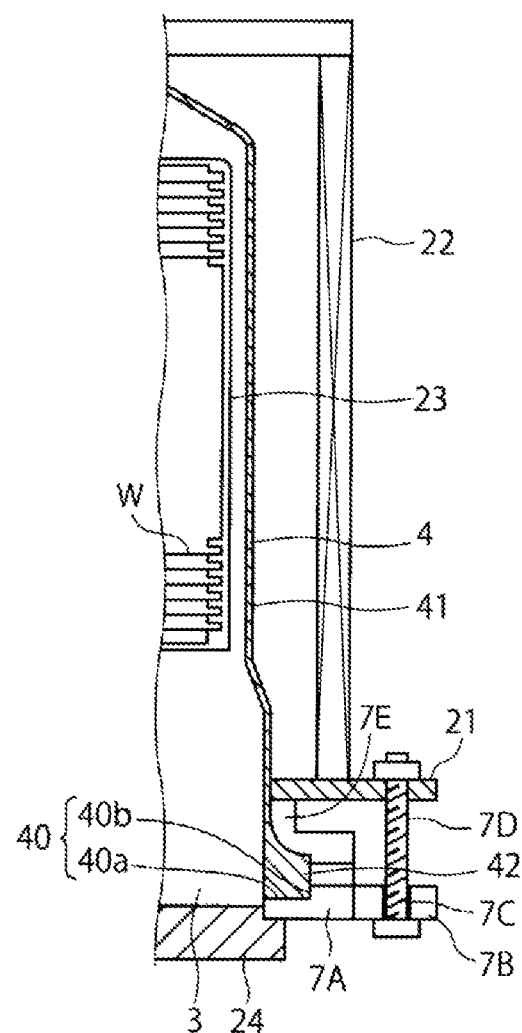
FIG. 13 is a partial longitudinal sectional view showing another modified embodiment of a heat treatment apparatus according to the present disclosure.

As shown in FIG. 13, the reaction tube 4 of the single tube structure is supported by a flange holding member 7A of a ring shape as the support member. A stepped portion 40 on which the reaction tube 4 is mounted is formed at an upper portion of the flange holding member 7A. The flange holding member 7A has at least three protrusions 7B on an outer periphery and is fixed to the base plate 21 by fastening a bolt 7D to a bore 7C formed in the protrusion 7B.

The reaction tube 4 has a reaction tube body 41 and the flange 42 formed at the lower end of the reaction tube body 41. The stepped portion 40 formed in the flange holding member 7A has the horizontal surface 40a on which the flange 42 of the reaction tube 4 is mounted and the vertical surface 40b coming into contact with the outer periphery of the flange 42 for positioning of the flange 42 in a radial direction.

The concave portion 44 (see FIG. 8) is formed in the outer periphery of the flange 42 of the reaction tube 4. A rotatable roller 35 (see FIG. 8), which engages the concave portion 44 of the flange 42 to position the reaction tube 4 in a circumferential direction, is installed in the stepped portion 40.

In the modified embodiment shown in FIG. 13, when the flange holding member 7A thermally contracts during the heat treatment process, the rotatable roller 35 rotates while the reaction tube 4 slides on the horizontal surface 40a of the stepped portion 40. As such, the rotatable roller 35 of the flange holding member 7A can completely engage the concave portion 44 of the reaction tube 4. Further, since the rotatable roller 35 is not caught at the entrance of the concave portion 44 of the reaction tube 4, the reaction tube 4 cannot be damaged.

Further, as shown in FIG. 13, the flange holding member 7A is installed below the base plate 21 through a connection member 7E. A heater 22, which heats the semiconductor wafers W supported by the wafer boat 23 within the reaction tube 4, is installed above the base plate 21.

Further, the lid 24 goes into contact with the flange holding member 7A to close the furnace opening.

Next, descriptions will be made as to still another embodiment of the present disclosure with reference to FIG. 14.

Figure 14:
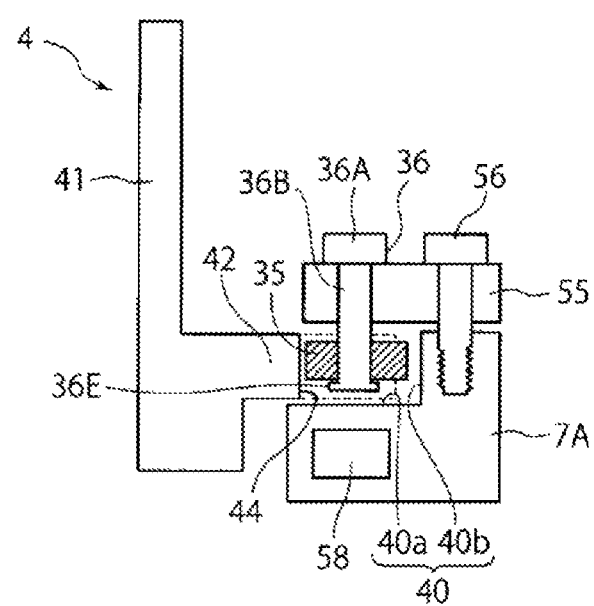
FIG. 14 is a partial longitudinal sectional view showing still another modified embodiment of a heat treatment apparatus according to the present disclosure.

In the modified embodiment shown in FIG. 14, an upper flange holding member 55 which supports the flange 42 of the reaction tube 4 in cooperation with the flange holding member 7A is installed above the flange holding member 7A. Further, the rotatable roller 35 is rotatably supported by a fixed pin 36 installed in the upper flange holding member 55. Other configurations are substantially identical to the modified embodiment shown in FIG. 13.

In the modified embodiment shown in FIG. 14, the same reference numerals are used to designate the same elements as the modified embodiment shown in FIG. 13 and descriptions thereof will be omitted.

As shown in FIG. 14, the reaction tube 4 of the single tube structure is supported by the flange holding member 7A of the ring shape as the support member. The stepped portion 40 on which the reaction tube 4 mounted is formed above the flange holding member 7A. Similarly to the modified embodiment shown in FIG. 13, the flange holding member 7A has at least three protrusions 7B (not shown in FIG. 14) and is fixed to the base plate 21 by the bolt 7D through the bore 7C formed in the protrusions 7B.

The reaction tube 4 has the reaction tube body 41 and the flange 42 formed at the lower end of the reaction tube body 41. The stepped portion 40 formed in the flange holding member 7A has the horizontal surface 40a on which the flange 42 of the reaction tube 4 is mounted and the vertical surface 40b coming into contact with the outer periphery of the flange 42 for positioning the flange 42 in a radial direction.

The concave portion 44 is formed in the outer periphery of the flange 42 of the reaction tube 4. The rotatable roller 35, which engages the concave portion 44 of the flange 42 to position the reaction tube 4 in a circumferential direction, is installed in the stepped portion 40.

As described above, the upper flange holding member 55 which supports the flange 42 of the reaction tube 4 in cooperation with the flange holding member 7A is fixed by a fixed screw 56. The rotatable roller 35 is rotatably supported by the fixed pin 36 installed in the upper flange holding member 55. In this case, a fixed pin 36 has a shaft 36B, a head 36A at an upper end of the shaft 36B and a ring shaped protrusion 36E at a lower end of the shaft 36B. The rotatable roller 35 is supported by the ring shaped protrusion 36E.

Further, a cooling water path 58 is formed in the flange holding member 7A. The cooling water path 58 serves to cool the flange holding member 7A using cooling water, thereby maintaining the shape of the stepped portion 40 and protecting the rotatable roller 35.

According to the foregoing present disclosure, when the support ring thermally contracts during the heat treatment process, the rotatable roller of the support ring moves the inner tube while rotating. As such, since the rotatable roller engages the concave portion of the inner tube, the damage of the inner tube can be avoided when the thermal contraction of the support ring.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
a reaction tube configured to process a plurality of substrates and having an inner tube and an outer tube, the inner tube including: a flange protruding outwardly from a lower end of the inner tube, and a concave portion formed in a portion of an outer peripheral side surface of the flange and having a curved surface formed in a sidewall of the concave portion;
a manifold configured to support the outer tube;
a support ring fixed to the manifold and configured to support the inner tube by mounting the flange of the inner tube on the support ring, the support ring having a stepped portion which includes a horizontal surface on which the flange of the inner tube is mounted and a vertical surface coming into contact with the outer periphery of the flange and positioning the flange in a radial direction; and
a rotatable roller rotatably installed on the support ring by fixing a fixed pin as a rotation axis of the rotatable roller to the support ring such that a portion of the rotatable roller is positioned at a side of the stepped portion of the support ring,
wherein the flange of the inner tube is mounted on the support ring such that the rotatable roller is centered in a space provided by the concave portion of the flange and in contact with the curved surface formed in the sidewall of the concave portion of the flange.

2. The heat treatment apparatus of claim 1, wherein the horizontal surface of the support ring has a center line average roughness (Ra) of 0.8 to 3.2.

3. The heat treatment apparatus of claim 1, further comprising a gas introduction space member radially protruding outward from the inner tube and extending vertically,
wherein the gas introduction space member receives a gas introduction unit.

4. The heat treatment apparatus of claim 3, wherein a protruding length of the gas introduction space member is shorter than a protruding length of the flange of the inner tube.

5. The heat treatment apparatus of claim 1, wherein an outer edge of the flange has a substantially circle shape.

6. The heat treatment apparatus of claim 1, further comprising an anti-inversion ring installed in the support ring and covering an upper portion of the flange of the inner tube,
wherein the anti-inversion ring includes a plurality of partial rings separated from each other.

7. The heat treatment apparatus of claim 6, wherein the anti-inversion ring is disposed and fixed such that they are symmetric with respect to a diameter of the inner tube passing the gas introduction space member.

* * * * *